(12) United States Patent
Toit

(10) Patent No.: US 7,379,711 B2
(45) Date of Patent: May 27, 2008

(54) METHOD AND APPARATUS CAPABLE OF MITIGATING THIRD ORDER INTER-MODULATION DISTORTION IN ELECTRONIC CIRCUITS

(75) Inventor: Nicolaas Du Toit, Columbia, MD (US)

(73) Assignee: Paratek Microwave, Inc., Columbia, MD (US)

( * ) Notice: Subject to any disclaimer, the term of this patent is extended or adjusted under 35 U.S.C. 154(b) by 411 days.

(21) Appl. No.: 11/193,739

(22) Filed: Jul. 29, 2005

(65) Prior Publication Data

US 2006/0025873 A1 Feb. 2, 2006

Related U.S. Application Data

(60) Provisional application No. 60/592,654, filed on Jul. 30, 2004.

(51) Int. Cl.
*H04B 1/04* (2006.01)
*H04B 1/10* (2006.01)

(52) U.S. Cl. .................. 455/67.11; 455/114.2; 455/295; 455/296

(58) Field of Classification Search .. 455/67.11–67.13, 455/114.2, 114.3, 295, 296–312
See application file for complete search history.

(56) References Cited

U.S. PATENT DOCUMENTS

| | | | |
|---|---|---|---|
| 5,312,790 A | 5/1994 | Sengupta et al. | 501/137 |
| 5,369,522 A * | 11/1994 | Tangonan et al. | 359/329 |
| 5,427,988 A | 6/1995 | Sengupta et al. | 501/137 |
| 5,486,491 A | 1/1996 | Sengupta et al. | 501/137 |
| 5,593,495 A | 1/1997 | Masuda et al. | 117/4 |
| 5,635,433 A | 6/1997 | Sengupta | 501/137 |
| 5,635,434 A | 6/1997 | Sengupta | 501/138 |
| 5,640,042 A | 6/1997 | Koscica et al. | 257/595 |
| 5,693,429 A | 12/1997 | Sengupat et al. | 428/699 |
| 5,694,134 A | 12/1997 | Barnes | 343/700 |
| 5,766,697 A | 6/1998 | Sengupta et al. | 427/585 |
| 5,830,591 A | 11/1998 | Sengupta et al. | 428/701 |
| 5,846,893 A | 12/1998 | Sengupta et al. | 501/137 |
| 5,886,867 A | 3/1999 | Chivukula et al. | 361/311 |
| 5,930,678 A * | 7/1999 | Alley et al. | 725/146 |
| 5,990,766 A | 11/1999 | Zhang et al. | 333/205 |
| 6,072,824 A * | 6/2000 | Huang et al. | 375/219 |
| 6,074,971 A | 6/2000 | Chiu et al. | 501/139 |
| 6,075,411 A * | 6/2000 | Briffa et al. | 330/149 |
| 6,259,899 B1 * | 7/2001 | Mandell et al. | 455/115.4 |
| 6,351,632 B1 * | 2/2002 | Yan et al. | 455/333 |
| 6,377,142 B1 | 4/2002 | Chiu et al. | 333/238 |
| 6,377,217 B1 | 4/2002 | Zhu et al. | 343/700 |
| 6,377,440 B1 | 4/2002 | Zhu et al. | 361/311 |
| 6,404,614 B1 | 6/2002 | Zhu et al. | 361/277 |
| 6,492,883 B2 | 12/2002 | Liang et al. | 333/132 |
| 6,514,895 B1 | 2/2003 | Chiu et al. | 501/137 |
| 6,525,630 B1 | 2/2003 | Zhu et al. | 333/205 |
| 6,531,936 B1 | 3/2003 | Chiu et al. | 333/164 |

(Continued)

*Primary Examiner*—Simon Nguyen
(74) *Attorney, Agent, or Firm*—James S. Finn

(57) ABSTRACT

An embodiment of the present invention provides a method of mitigating third order inter-modulation distortion in electronic circuits, comprising estimating an IP3 of the circuits using an empirical equation which includes at least one or more of the factors $IP3 \sim IP3o - 20 \log Q + 10 \log F + 10 \log C - 17.3 \log k$ dBm and optimizing one or more of the factors such that the third order inter-modulation distortion is mitigated.

24 Claims, 2 Drawing Sheets

U.S. PATENT DOCUMENTS

| | | | |
|---|---|---|---|
| 6,535,076 B2 | 3/2003 | Partridge et al. | 333/17.1 |
| 6,538,603 B1 | 3/2003 | Chen et al. | 342/372 |
| 6,556,102 B1 | 4/2003 | Sengupta et al. | 333/161 |
| 6,590,468 B2 | 7/2003 | du Toit et al. | 333/17.3 |
| 6,597,265 B2 | 7/2003 | Liang et al. | 333/204 |
| 6,876,843 B2 * | 4/2005 | Madni et al. | 455/311 |
| 7,180,368 B2 * | 2/2007 | Hirose et al. | 330/149 |

* cited by examiner

METHOD AND APPARATUS CAPABLE OF MITIGATING THIRD ORDER INTER-MODULATION DISTORTION IN ELECTRONIC CIRCUITS

CROSS REFERENCE TO RELATED PATENT APPLICATION

This application claims the benefit of U.S. Provisional Patent Application No. 60/592,654, filed Jul. 30, 2004, entitled, "SYSTEM AND METHOD OF MITIGATING THIRD ORDER INTER-MODULATION DISTORTION IN ELECTRONIC CIRCUITS."

BACKGROUND OF THE INVENTION

While the problem of calculating or measuring third order intermodulation distortion has been well studied and many references to the successful determination of such distortion can be found, the need exists for explicit design techniques that enable the selection of tunable capacitors and the design of circuit parameters for desired third order intermodulation distortion levels. In particular, a strong need exists for a method and apparatus capable of mitigating third order inter-modulation distortion in electronic circuits and systems incorporating voltage tunable capacitors

SUMMARY OF THE INVENTION

An embodiment of the present invention provides a method of mitigating third order inter-modulation distortion in electronic circuits, comprising estimating an IP3 of the circuits using an empirical equation which includes at least one or more of the factors IP3~IP3o−20 log Q+10 log F+10 log C−17.3 log k dBm and optimizing one or more of the factors such that the third order inter-modulation distortion is mitigated. The IP3o may be related to the second and higher order derivatives of a C=f(V) function of a Varactor such that when these derivatives are reduced or tend towards zero, IP3o is increased or tends to infinity thereby optimizing IP3o. The magnitude of the derivatives may be reduced by stretching the C=f(V) function over a wider voltage range by increasing a gap between electrodes of the varactor thereby making the Varactor less tunable or the magnitude of the derivatives may be reduced by stretching the C=f(V) function over a wider voltage range by altering the composition of the tunable dielectric material of the varactor thereby making the Varactor less tunable. Also, magnitude of the derivatives may be reduced by stretching the C=f(V) function over a wider voltage range by applying a DC bias electric field vector in a direction not parallel to an RF electric field within tunable dielectric material in the varactor; additional terminals may be used for the DC bias such that the RF fields are not affected by their presence by making them thin and perpendicular to the RF electric field and/or making them of high resistance material.

Further, the derivatives may be reduced by operating the varactor at a bias condition where the C=f(V) function has an inflection point thereby making the Varactor less tunable or by operating MEMS voltage tunable capacitors at RF voltage swings smaller than the magnitude of the bias voltage changes required to overcome the mechanical stiction of the moving parts of the MEMS voltage tunable capacitors.

In an embodiment of the present invention the optimizing of one or more of the factors may be done by minimizing 20 log Q by minimizing the reactive component of impedances in the area of the Varactor in the Circuit. Also, the optimizing one or more of the factors may be done by maximizing 10 log F by designing a frequency plan of a system such that the intermediate frequency at which voltage tuning is to be implemented is chosen to be as high as possible.

In another embodiment of the present invention the optimizing of one or more of the factors may be done by maximizing 10 log C by one or more of the following methods:

designing the circuit for large C value Varactors, each varactor having a high capacitance, C by scaling the impedances in the Circuit to low levels and arranging for the appropriate impedance matching at the RF port(s); or designing the circuit for large C value, with a high C value obtained by connecting two or more Varactors in parallel by scaling the impedances in the Circuit to low levels and arranging for the appropriate impedance matching at the RF port(s); or designing the Circuit for low capacitance value, with a high C value obtained by connecting two or more Varactors in series by scaling the impedances in the Circuit to high levels and arranging for the appropriate impedance matching at the RF port(s); or designing the circuit for medium capacitance value, with a high C value obtained by connecting three or more Varactors in a series/parallel combination.

In yet another embodiment of the present invention the optimizing of one or more of the factors may be done by minimizing 17.3 log k by one or more of the following methods:

coupling the varactor lightly into a resonator if a resonator is present in the circuit thereby yielding a low k value; or connecting a non-tuning capacitor in series with the varactor; or connecting a non-tuning capacitor in parallel with the varactor.

Yet another embodiment of the present invention provides an apparatus, comprising at least one electronic circuit, the electronic circuit potentially including third order inter-modulation distortion, wherein the apparatus is capable of mitigating the inter-modulation distortion by estimating an IP3 of the at least one circuit using an empirical equation which includes at least one or more of the factors IP3~IP3o−20 log Q+10 log F+10 log C−17.3 log k dBm and optimizing one or more of the factors such that the third order inter-modulation distortion is mitigated.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DESCRIPTION OF THE PREFERRED EMBODIMENT

Figure 1:
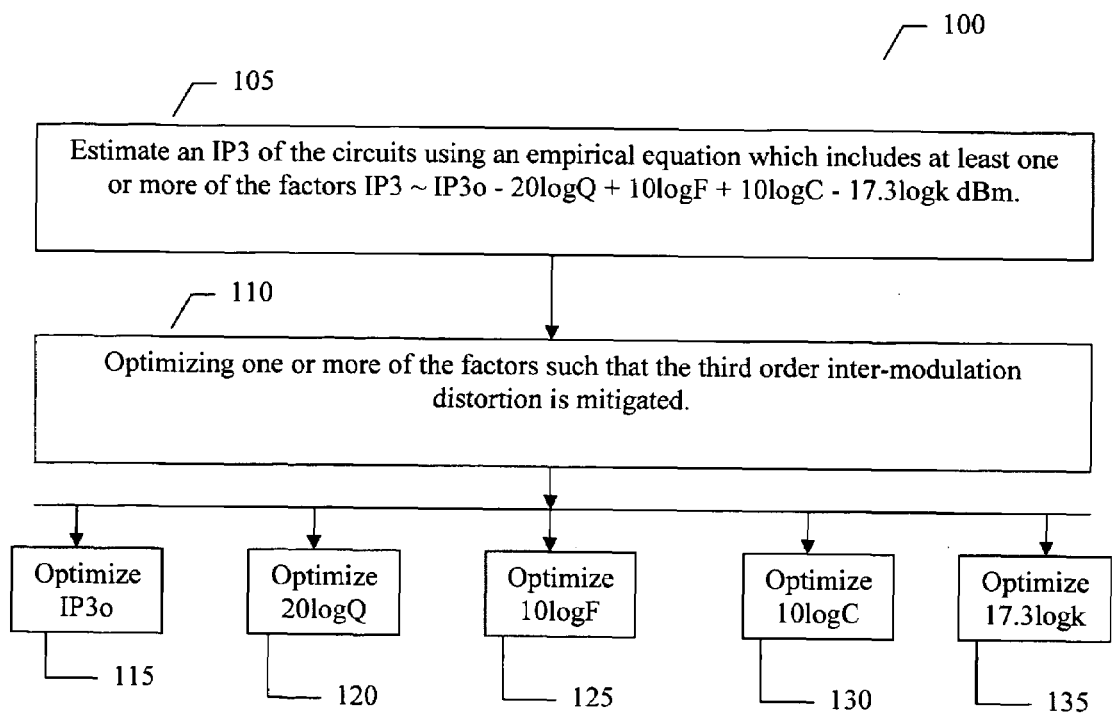
FIG. 1 is a flowchart depicting the operation of the method of one embodiment of the present invention.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

An embodiment of the present invention may be used in single resonator UHF filter circuits with voltage tunable dielectric capacitors, but should be equally applicable and not limited to RF, Microwave or Millimeter wave amplifiers, filters, mixers, antennas and phase shifters (herein referred to as the "Circuit") incorporating one or more voltage tunable capacitors (herein referred to as "Varactors") such as and not limited to semiconductor varactors, voltage tunable dielectric capacitors, ferroelectric capacitors, MEMS voltage tunable capacitors Parascan® voltage tunable capacitors, Parascan® variable capacitors, Parascan® tunable dielectric capacitors and Parascan® varactors.

The term Parascan® as used herein is a trademarked term indicating a tunable dielectric material developed by the assignee of the present invention. Parascan® tunable dielectric materials have been described in several patents. Barium strontium titanate ($BaTiO_3$-$SrTiO_3$), also referred to as BSTO, is used for its high dielectric constant (200-6,000) and large change in dielectric constant with applied voltage (25-75 percent with a field of 2 Volts/micron). Tunable dielectric materials including barium strontium titanate are disclosed in U.S. Pat. No. 5,312,790 to Sengupta, et al. entitled "Ceramic Ferroelectric Material"; U.S. Pat. No. 5,427,988 by Sengupta, et al. entitled "Ceramic Ferroelectric Composite Material-BSTO-MgO"; U.S. Pat. No. 5,486,491 to Sengupta, et al. entitled "Ceramic Ferroelectric Composite Material-BSTO-$ZrO_2$"; U.S. Pat. No. 5,635,434 by Sengupta, et al. entitled "Ceramic Ferroelectric Composite Material-BSTO-Magnesium Based Compound"; U.S. Pat. No. 5,830,591 by Sengupta, et al. entitled "Multilayered Ferroelectric Composite Waveguides"; U.S. Pat. No. 5,846,893 by Sengupta, et al. entitled "Thin Film Ferroelectric Composites and Method of Making"; U.S. Pat. No. 5,766,697 by Sengupta, et al. entitled "Method of Making Thin Film Composites"; U.S. Pat. No. 5,693,429 by Sengupta, et al. entitled "Electronically Graded Multilayer Ferroelectric Composites"; U.S. Pat. No. 5,635,433 by Sengupta entitled "Ceramic Ferroelectric Composite Material BSTO-ZnO"; U.S. Pat. No. 6,074,971 by Chiu et al. entitled "Ceramic Ferroelectric Composite Materials with Enhanced Electronic Properties BSTO Mg Based Compound-Rare Earth Oxide". These patents are incorporated herein by reference. The materials shown in these patents, especially BSTO-MgO composites, show low dielectric loss and high tunability. Tunability is defined as the fractional change in the dielectric constant with applied voltage.

Barium strontium titanate of the formula $Ba_xSr_{1-x}TiO_3$ is a preferred electronically tunable dielectric material due to its favorable tuning characteristics, low Curie temperatures and low microwave loss properties. In the formula $Ba_xSr_{1-x}TiO_3$, x can be any value from 0 to 1, preferably from about 0.15 to about 0.6. More preferably, x is from 0.3 to 0.6.

Other electronically tunable dielectric materials may be used partially or entirely in place of barium strontium titanate. An example is $Ba_xCa_{1-x}TiO_3$, where x is in a range from about 0.2 to about 0.8, preferably from about 0.4 to about 0.6. Additional electronically tunable ferroelectrics include $Pb_xZr_{1-x}TiO_3$ (PZT) where x ranges from about 0.0 to about 1.0, $Pb_xZr_{1-x}SrTiO_3$ where x ranges from about 0.05 to about 0.4, $KTa_xNb_{1-x}O_3$ where x ranges from about 0.0 to about 1.0, lead lanthanum zirconium titanate (PLZT), $PbTiO_3$, $BaCaZrTiO_3$, $NaNO_3$, $KNbO_3$, $LiNbO_3$, $LiTaO_3$, $PbNb_2O_6$, $PbTa_2O_6$, $KSr(NbO_3)$ and $NaBa_2(NbO_3)$ $5KH_2PO_4$, and mixtures and compositions thereof. Also, these materials can be combined with low loss dielectric materials, such as magnesium oxide (MgO), aluminum oxide ($Al_2O_3$), and zirconium oxide ($ZrO_2$), and/or with additional doping elements, such as manganese (MN), iron (Fe), and tungsten (W), or with other alkali earth metal oxides (i.e. calcium oxide, etc.), transition metal oxides, silicates, niobates, tantalates, aluminates, zirconnates, and titanates to further reduce the dielectric loss.

In addition, the following U.S. patent applications, assigned to the assignee of this application, disclose additional examples of tunable dielectric materials: U.S. application Ser. No. 09/594,837 filed Jun. 15, 2000, entitled "Electronically Tunable Ceramic Materials Including Tunable Dielectric and Metal Silicate Phases"; U.S. application Ser. No. 09/768,690 filed Jan. 24, 2001, entitled "Electronically Tunable, Low-Loss Ceramic Materials Including a Tunable Dielectric Phase and Multiple Metal Oxide Phases"; U.S. application Ser. No. 09/882,605 filed Jun. 15, 2001, entitled "Electronically Tunable Dielectric Composite Thick Films And Methods Of Making Same"; U.S. application Ser. No. 09/834,327 filed Apr. 13, 2001, entitled "Strain-Relieved Tunable Dielectric Thin Films"; and U.S. Provisional Application Ser. No. 60/295,046 filed Jun. 1, 2001 entitled "Tunable Dielectric Compositions Including Low Loss Glass Frits". These patent applications are incorporated herein by reference.

The tunable dielectric materials can also be combined with one or more non-tunable dielectric materials. The non-tunable phase(s) may include MgO, $MgAl_2O_4$, $MgTiO_3$, $Mg_2SiO_4$, $CaSiO_3$, $MgSrZrTiO_6$, $CaTiO_3$, $Al_2O_3$, $SiO_2$ and/or other metal silicates such as $BaSiO_3$ and $SrSiO_3$. The non-tunable dielectric phases may be any combination of the above, e.g., MgO combined with $MgTiO_3$, MgO combined with $MgSrZrTiO_6$, MgO combined with $Mg_2SiO_4$, MgO combined with $Mg_2SiO_4$, $Mg_2SiO_4$ combined with $CaTiO_3$ and the like.

Additional minor additives in amounts of from about 0.1 to about 5 weight percent can be added to the composites to additionally improve the electronic properties of the films. These minor additives include oxides such as zirconnates, tannates, rare earths, niobates and tantalates. For example, the minor additives may include $CaZrO_3$, $BaZrO_3$, $SrZrO_3$, $BaSnO_3$, $CaSnO_3$, $MgSnO_3$, $Bi_2O_3/2SnO_2$, $Nd_2O_3$, $Pr_7O_{11}$, $Yb_2O_3$, $Ho_2O_3$, $La_2O_3$, $MgNb_2O_6$, $SrNb_2O_6$, $BaNb_2O_6$, $MgTa_2O_6$, $BaTa_2O_6$ and $Ta_2O_3$.

Thick films of tunable dielectric composites may comprise $Ba_{1-x}Sr_xTiO_3$, where x is from 0.3 to 0.7 in combination with at least one non-tunable dielectric phase selected from MgO, $MgTiO_3$, $MgZrO_3$, $MgSrZrTiO_6$, $Mg_2SiO_4$, $CaSiO_3$, $MgAl_2O_4$, $CaTiO_3$, $Al_2O_3$, $SiO_2$, $BaSiO_3$ and $SrSiO_3$. These compositions can be BSTO and one of these components, or two or more of these components in quantities from 0.25 weight percent to 80 weight percent with BSTO weight ratios of 99.75 weight percent to 20 weight percent.

The electronically tunable materials may also include at least one metal silicate phase. The metal silicates may include metals from Group 2A of the Periodic Table, i.e., Be, Mg, Ca, Sr, Ba and Ra, preferably Mg, Ca, Sr and Ba. Preferred metal silicates include $Mg_2SiO_4$, $CaSiO_3$, $BaSiO_3$ and $SrSiO_3$. In addition to Group 2A metals, the present metal silicates may include metals from Group 1A, i.e., Li, Na, K, Rb, Cs and Fr, preferably Li, Na and K. For example, such metal silicates may include sodium silicates such as $Na_2SiO_3$ and $NaSiO_3$-$5H_2O$, and lithium-containing silicates such as LiAlSiO4, Li2SiO3 and Li4SiO4. Metals from Groups 3A, 4A and some transition metals of the Periodic Table may also be suitable constituents of the metal silicate phase. Additional metal silicates may include Al2Si2O7, ZrSiO4, KalSi3O8, NaAlSi3O8, CaAl2Si2O8, CaMgSi2O6, BaTiSi3O9 and Zn2SiO4. The above tunable materials can be tuned at room temperature by controlling an electric field that is applied across the materials.

In addition to the electronically tunable dielectric phase, the electronically tunable materials can include at least two additional metal oxide phases. The additional metal oxides may include metals from Group 2A of the Periodic Table, i.e., Mg, Ca, Sr, Ba, Be and Ra, preferably Mg, Ca, Sr and Ba. The additional metal oxides may also include metals from Group 1A, i.e., Li, Na, K, Rb, Cs and Fr, preferably Li, Na and K. Metals from other Groups of the Periodic Table may also be suitable constituents of the metal oxide phases. For example, refractory metals such as Ti, V, Cr, Mn, Zr, Nb, Mo, Hf, Ta and W may be used. Furthermore, metals such as Al, Si, Sn, Pb and Bi may be used. In addition, the metal oxide phases may comprise rare earth metals such as Sc, Y, La, Ce, Pr, Nd and the like.

The additional metal oxides may include, for example, zirconnates, silicates, titanates, aluminates, stannates, niobates, tantalates and rare earth oxides. Preferred additional metal oxides include Mg2SiO4, MgO, CaTiO3, MgZrSrTiO6, MgTiO3, MgAl2O4, WO3, SnTiO4, ZrTiO4, CaSiO3, CaSnO3, CaWO4, CaZrO3, MgTa2O6, MgZrO3, MnO2, PbO, Bi2O3 and La2O3. Particularly preferred additional metal oxides include Mg2SiO4, MgO, CaTiO3, MgZrSrTiO6, MgTiO3, MgAl2O4, MgTa2O6 and MgZrO3.

The additional metal oxide phases are typically present in total amounts of from about 1 to about 80 weight percent of the material, preferably from about 3 to about 65 weight percent, and more preferably from about 5 to about 60 weight percent. In one preferred embodiment, the additional metal oxides comprise from about 10 to about 50 total weight percent of the material. The individual amount of each additional metal oxide may be adjusted to provide the desired properties. Where two additional metal oxides are used, their weight ratios may vary, for example, from about 1:100 to about 100:1, typically from about 1:10 to about 10:1 or from about 1:5 to about 5:1. Although metal oxides in total amounts of from 1 to 80 weight percent are typically used, smaller additive amounts of from 0.01 to 1 weight percent may be used for some applications.

The additional metal oxide phases can include at least two Mg-containing compounds. In addition to the multiple Mg-containing compounds, the material may optionally include Mg-free compounds, for example, oxides of metals selected from Si, Ca, Zr, Ti, Al and/or rare earths.

Figure 2:
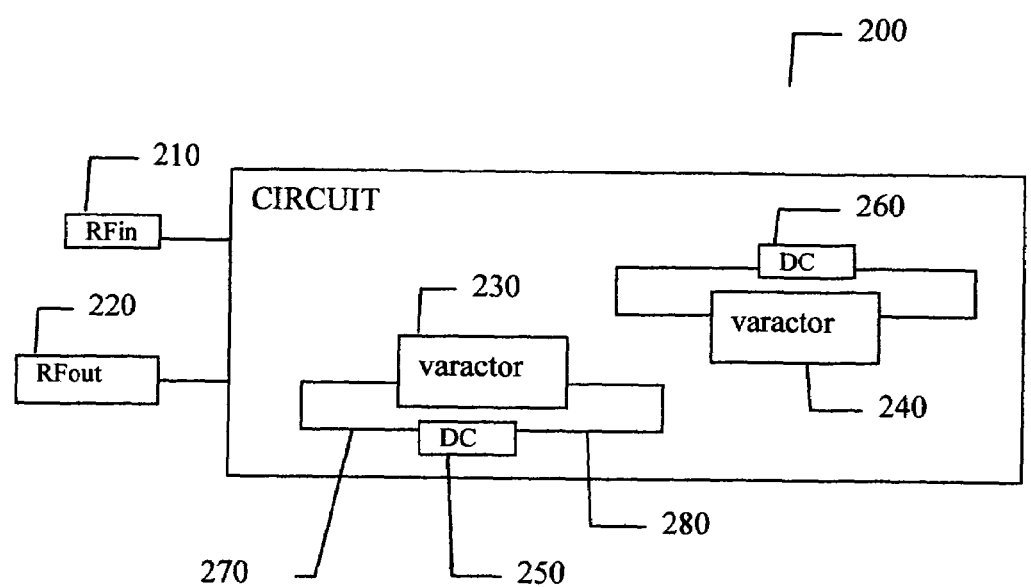
FIG. 2 shows an embodiment of the present invention where it may only be necessary that the Circuits have one or more general RF port through which RF energy is exchanged with the circuit.

Looking now at FIG. 2, in an embodiment of the present invention it may only be necessary that the Circuits 200 have one or more general RF ports 210 and 220 through which RF energy is exchanged with the circuit 200. Further, it may only be necessary for the Varactors 230,240 to have two or more terminals (e.g. 270 and 280 connected to DC bias 250 and 260) for which voltages and currents may be associated such that capacitances observed between the terminals 270 and 280 may be described as general functions of at least the voltages observed at such terminals, viz. C=f(V).

In characterizing third order harmonic distortion, the concept of third order intercept, IP3, is used herein, and may be the point on a Circuit's output versus input power plane where the extrapolated fundamental frequency (f1 or f2) output power line intercepts the third order intermodulation product's power line (2f1-f2 or 2f2-f1).

Although not limited in this respect, when designing Circuits for specified IP3 performance, it is convenient to estimate the IP3 of such Circuits using the empirical equation $$IP3 \sim IP3o - 20 \log Q + 10 \log F + 10 \log C - 17.3 \log k \text{ dBm}$$

where IP3o is a circuit invariant and frequency invariant factor inherent to the varactor at specified bias conditions in dBm, Q is the loaded Q-factor of the Circuit, F is the resonant frequency in MHz, C is the capacitance in pF of the varactor at said specified bias conditions and k is the varactor-to-resonator coupling factor, defined as the fraction of the total capacitive current of the resonator flowing through the varactor. The equation is valid for Circuits containing a single resonant circuit with a single Varactor, but it has been found to predict trends well in multiple-resonator Circuits with multiple Varactors and thus the present invention is not limited to single resonant circuit with a single resonator.

Some embodiments of the present invention provide techniques of maximizing IP3o. IP3o is related to the second and higher order derivatives of the C=f(V) function of the Varactors such that when these derivatives are reduced or tend towards zero, IP3o is increased or tends to infinity. The magnitude of these derivatives may be reduced by applying one or more of the following techniques:

a. Stretching the C=f(V) function over a wider voltage range, i.e. making the Varactor less tunable. This can be achieved by increasing the gap between the electrodes of the varactor.

b. Stretching the C=f(V) function over a wider voltage range, i.e. making the Varactor less tunable. This can be achieved by altering the composition of the tunable dielectric material.

c. Applying the DC bias electric field in a direction perpendicular to the RF electric field within the tunable dielectric material. This would require additional terminals for the DC bias designed such that the RF fields are not affected by their presence, such as making them thin and perpendicular to the RF electric field and/or making them of high resistance material.

d. Operating the varactor at a bias condition where the C=f(V) function has an inflection point, viz. second derivative equals zero and higher derivatives are essentially nil. In case of Parascan® voltage tunable capacitors, Parascan® variable capacitors, Parascan® tunable dielectric capacitors and Parascan® varactors and generally ferroelectric capacitors, such an inflection point always exists somewhere in the lower half of the useful voltage range.

e. Operating MEMS voltage tunable capacitors at RF voltage swings smaller than the magnitude of the bias voltage changes required to overcome the mechanical stiction of the moving parts of the MEMS voltage tunable capacitors.

It is understood that any, all or some of the aforementioned techniques may be utilized in the present invention. Indeed, there are 17 permutations possible when applying these techniques together: a, b, c, d, e, a+b, a+c, a+d, b+c, b+d, c+d, a+b+c, b+c+d, a+c+d, a+b+d, a+b+c+d, or none and all of such permutations are intended the be within the scope of the present invention.

Embodiments of the present invention also provide techniques of minimizing 20 log Q. To this end, the Circuit may be designed to be as broadband as possible, minimizing the reactive component of impedances in the area of the varactor in the Circuit. This option might not be very practical in case of filters, but certainly would apply for, but is not limited to, amplifiers, antennas, mixers and phase shifters.

Embodiments of the present invention also provide techniques of maximizing 10 log F. When designing the frequency plan of a system, the intermediate frequency at which voltage tuning is to be implemented, may be chosen to be as high as possible.

Embodiments of the present invention also provide techniques of maximizing 10 log C. To this end, one of the following alternative techniques may be applied:

a. Designing the Circuit for large C value varactors, each varactor having a high capacitance, C. This may be achieved by scaling the impedances in the Circuit to low levels and arranging for the appropriate impedance matching at the RF port(s).

b. Designing the Circuit for large C value, with a high C value obtained by connecting two or more Varactors in parallel. This may be achieved by scaling the impedances in the Circuit to low levels and arranging for the appropriate impedance matching at the RF port(s).

c. Designing the Circuit for low capacitance value, with a high C value obtained by connecting two or more Varactors in series. This may be achieved by scaling the impedances in the Circuit to high levels and arranging for the appropriate impedance matching at the RF port(s).

d. Designing the Circuit for medium capacitance value, with a high C value obtained by connecting three or more Varactors in a series/parallel combination.

Embodiments of the present invention also provide techniques of minimizing 17.3 log k. To this end, one of the following alternative techniques may be applied:

a. In the case of a resonator being present in the Circuit, the varactor may be coupled lightly into the resonator, yielding a low k value.

b. A non-tuning capacitor may be connected in series with the varactor. The smaller the non-tuning capacitor, the lower k would become.

c. A non-tuning capacitor may be connected in parallel with the Varactor. The larger the non-tuning capacitor, the lower k would become.

It is understood that the present invention is not limited to optimizing any particular factor, in any particular way. All of the aforementioned factors and methodologies of optimizing these factors may be mixed and matched as design parameters require. Indeed, the total number of embodiments when permutations of the described techniques are applied together is calculated as: N=(17 from A)×(2 from B)×(2 from C)×(5 from D)×(4 from E)−1=1359 distinct embodiments. All of which are intended to be within the scope of the present invention.

Turning now to FIG. 1, illustrated generally at 100, is a flowchart depicting the operation of the method of one embodiment of the present invention. This method of mitigating third order inter-modulation distortion in electronic circuits, comprises estimating an IP3 of the circuits using an empirical equation which includes at least one or more of the factors IP3~IP3o−20 log Q+10 log F+10 log C−17.3 log k dBm 105 and optimizing one or more of the factors such that the third order inter-modulation distortion is mitigated 110. Although not limited in this respect, the optimization includes optimizing all or some or any of the following factors:

IP3o-115
20 log Q-120
10 log F-125
10 log C-130
17.3 log k-135

While the present invention has been described in terms of what are at present believed to be its preferred embodiments, those skilled in the art will recognize that various modifications to the disclose embodiments can be made without departing from the scope of the invention as defined by the following claims.

What is claimed is:

1. A method of mitigating third order inter-modulation distortion in electronic circuits, comprising:
estimating an IP3 of said circuits using an empirical equation which includes at least one or more of the factors IP3~IP3o−20 log Q+10 log F+10 log C−17.3 log k dBm and optimizing one or more of said factors such that the third order inter-modulation distortion is mitigated.

2. The method of claim 1, wherein IP3o is related to the second and higher order derivatives of a C=f(V) function of a Varactor such that when these derivatives are reduced or tend towards zero, IP3o is increased or tends to infinity thereby optimizing IP3o.

3. The method of claim 2, wherein the magnitude of said derivatives are reduced by stretching said C=f(V) function over a wider voltage range by increasing a gap between electrodes of said varactor thereby making the Varactor less tunable.

4. The method of claim 2, wherein the magnitude of said derivatives are reduced by stretching said C=f(V) function over a wider voltage range by altering the composition of the tunable dielectric material of said varactor thereby making the Varactor less tunable.

5. The method of claim 2, wherein the magnitude of said derivatives are reduced by stretching said C=f(V) function over a wider voltage range by applying a DC bias electric field vector in a direction not parallel to an RF electric field within tunable dielectric material in said varactor.

6. The method of claim 5, further comprising additional terminals for said DC bias such that said RF fields are not affected by their presence by making them thin and perpendicular to said RF electric field and/or making them of high resistance material.

7. The method of claim 2, wherein the magnitude of said derivatives are reduced by operating the varactor at a bias condition where the C=f(V) function has an inflection point.

8. The method of claim 2, wherein the magnitude of said derivatives are reduced by Operating MEMS voltage tunable capacitors at RF voltage swings smaller than the magnitude of the bias voltage changes required to overcome the mechanical stiction of the moving parts of the MEMS voltage tunable capacitors.

9. The method of claim 1, wherein said optimizing one or more of said factors is done by minimizing 20 log Q by minimizing the reactive component of impedances in the area of the Varactor in the Circuit.

10. The method of claim 1, wherein said optimizing one or more of said factors is done by maximizing 10 log F by designing a frequency plan of a system such that the intermediate frequency at which voltage tuning is to be implemented is chosen to be as high as possible.

11. The method of claim 1, wherein said optimizing one or more of said factors is done by maximizing 10 log C by one or more of the following methods:
designing the circuit for large C value Varactors, each varactor having a high capacitance, C by scaling the impedances in the Circuit to low levels and arranging for the appropriate impedance matching at the RF port(s); or designing the circuit for large C value, with a high C value obtained by connecting two or more Varactors in parallel by scaling the impedances in the Circuit to low levels and arranging for the appropriate impedance matching at the RF port(s); or designing the Circuit for low capacitance value, with a high C value obtained by connecting two or more Varactors in series by scaling the impedances in the Circuit to high levels and arranging for the appropriate impedance matching at the RF port(s); or designing the circuit for medium capacitance value, with a high C value obtained by connecting three or more Varactors in a series/parallel combination.

12. The method of claim 1, wherein said optimizing one or more of said factors is done by minimizing 17.3 log k by one or more of the following methods:

coupling said varactor lightly into a resonator if a resonator is present in said circuit thereby yielding a low k value; or connecting a non-tuning capacitor in series with said varactor; or connecting a non-tuning capacitor in parallel with the varactor.

13. An apparatus, comprising:

at least one electronic circuit, said electronic circuit potentially including third order inter-modulation distortion, wherein said apparatus is capable of mitigating said inter-modulation distortion by:

estimating an IP3 of said at least one circuit using an empirical equation which includes at least one or more of the factors IP3~IP3o−20 log Q+10 log F+10 log C−17.3 log k dBm and optimizing one or more of said factors such that the third order inter-modulation distortion is mitigated.

14. The apparatus of claim 13, wherein IP3o is related to the second and higher order derivatives of a C=f(V) function of a Varactor such that when these derivatives are reduced or tend towards zero, IP3o is increased or tends to infinity thereby optimizing IP3o.

15. The apparatus of claim 14, wherein the magnitude of said derivatives are reduced by stretching said C=f(V) function over a wider voltage range by increasing a gap between electrodes of said varactor thereby making the Varactor less tunable.

16. The apparatus of claim 14, wherein the magnitude of said derivatives are reduced by stretching said C=f(V) function over a wider voltage range by altering the composition of the tunable dielectric material of said varactor thereby making the Varactor less tunable.

17. The apparatus of 14, wherein the magnitude of said derivatives are reduced by stretching said C=f(V) function over a wider voltage range by applying a DC bias electric field in a direction perpendicular to an RF electric field within tunable dielectric material in said varactor.

18. The apparatus of claim 17, further comprising additional terminals for said DC bias such that said RF fields are not affected by their presence by making them thin and perpendicular to said RF electric field and/or making them of high resistance material.

19. The apparatus of claim 14, wherein the magnitude of said derivatives are reduced by operating the varactor at a bias condition where the C=f(V) function has an inflection point.

20. The apparatus of claim 14, wherein the magnitude of said derivatives are reduced by Operating MEMS voltage tunable capacitors at RF voltage swings smaller than the magnitude of the bias voltage changes required to overcome the mechanical stiction of the moving parts of the MEMS voltage tunable capacitors.

21. The apparatus of claim 13, wherein said optimizing one or more of said factors is done by minimizing 20 log Q by minimizing the reactive component of impedances in the area of the Varactor in the Circuit.

22. The apparatus of claim 13, wherein said optimizing one or more of said factors is done by maximizing 10 log F by designing a frequency plan of a system such that the intermediate frequency at which voltage tuning is to be implemented is chosen to be as high as possible.

23. The apparatus of claim 13, wherein said optimizing one or more of said factors is done by maximizing 10 log C by one of the following methods:

designing the circuit for large C value Varactors, each varactor having a high capacitance, C by scaling the impedances in the Circuit to low levels and arranging for the appropriate impedance matching at the RF port(s); or designing the circuit for large C value, with a high C value obtained by connecting two or more Varactors in parallel by scaling the impedances in the Circuit to low levels and arranging for the appropriate impedance matching at the RF port(s); or designing the Circuit for low capacitance value, with a high C value obtained by connecting two or more Varactors in series by scaling the impedances in the Circuit to high levels and arranging for the appropriate impedance matching at the RF port(s); or designing the circuit for medium capacitance value, with a high C value obtained by connecting three or more Varactors in a series/parallel combination.

24. The apparatus of claim 13, wherein said optimizing one or more of said factors is done by minimizing 17.3 log k by one or more of the following methods:

coupling said varactor lightly into a resonator if a resonator is present in said circuit thereby yielding a low k value; or connecting a non-tuning capacitor in series with said varactor; or connecting a non-tuning capacitor in parallel with the varactor.

* * * * *